United States Patent
Schemmann et al.

(10) Patent No.: US 6,593,811 B2
(45) Date of Patent: Jul. 15, 2003

(54) NONLINEAR FEEDBACK LINEARIZER

(75) Inventors: Marcel F. C. Schemmann, Echt (NL); Zhijian Sun, Jamesville, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 13 days.

(21) Appl. No.: 09/892,974

(22) Filed: Jun. 27, 2001

(65) Prior Publication Data

US 2003/0001670 A1 Jan. 2, 2003

(51) Int. Cl.$^7$ .................................................. H03F 1/36
(52) U.S. Cl. ..................... 330/110; 330/271; 330/260; 330/107; 330/149
(58) Field of Search ................................ 330/107, 110, 330/149, 271, 260

(56) References Cited

U.S. PATENT DOCUMENTS

| | | | | |
|---|---|---|---|---|
| 3,375,460 A | * | 3/1968 | Miller | 330/110 |
| 3,440,557 A | * | 4/1969 | Sundeen, Jr. | 330/110 |
| 3,548,334 A | * | 12/1970 | Tomita et al. | 330/110 |
| 4,462,008 A | * | 7/1984 | Katakura | 330/110 |
| 5,302,911 A | * | 4/1994 | Miyashita | 330/110 |

FOREIGN PATENT DOCUMENTS

JP 1200709 * 8/1989 ................. 330/110

OTHER PUBLICATIONS

Yang et al. "DC to DC Buck Converters with Novel Current Mode Control" Power Electronics Specialists Conference, 1999 30$^{th}$ Annual IEEE, vol. 2 pp 1158–1164.*

* cited by examiner

Primary Examiner—Michael B. Shingleton
(74) Attorney, Agent, or Firm—Michael E. Belk

(57) ABSTRACT

The present invention relates generally to an amplifier such as that with the radio frequency (RF) spectrum having a nonlinear feedback loop to cancel out distortions in the input signal, and method therefor.

18 Claims, 1 Drawing Sheet

NONLINEAR FEEDBACK LINEARIZER

BACKGROUND OF THE INVENTION

1. Technical Field

The present invention relates generally to an amplifier such as that with the radio frequency (RF) spectrum having a nonlinear feedback loop to cancel out distortions in the input signal, and method therefor.

2. Related Art

In amplifier design, a balance exists between distortion performance and efficiency. Linear amplifiers which operate under certain conditions create little distortion but are inefficient. Conversely, nonlinear amplifiers are reasonably efficient but are known to introduce significant distortion. While both efficiency and distortion are important considerations in amplifier design, efficiency becomes increasingly important at high power levels. Because of their efficiency, nonlinear amplifiers are largely preferred, leaving the problem of distortion to be solved.

Radio frequency (RF) amplifiers known in the art can be equipped with linearization circuitry. The linearization circuitry is typically placed in front of (i.e., predistortion), around (i.e., feedback), or after (i.e., feedforward) the amplifier. However, in each of these techniques, undesirable losses and, in some cases, increased power dissipation are incurred.

There is thus a need for a linearization circuit which can enhance amplifier linearity for both broadband and narrowband signals, while eliminating undesirable losses and reducing unwanted power dissipation.

SUMMARY OF THE INVENTION

It is therefore a feature of the present invention to overcome the above shortcomings related to increased losses and power dissipation of typical linearization circuits by providing a novel linearization circuit that modifies the amplifier without increasing either losses or power dissipation, and which has the additional benefit of not reducing the gain of the amplifier. The disclosed linearization circuit can nevertheless be applied to broadband technologies, and as such, is applicable to the entire cable television (CATV) frequency range. The disclosed linearization circuit is also expandable in frequency range so as to be useful in narrowband applications.

The present invention eliminates losses and power dissipation problems due to the linearization circuit by utilizing the knowledge that in most operating regimes the distortion in a RF amplifier is significantly smaller than the overall output power. For this reason, a feedback loop with nonlinear characteristics can be designed to cancel out these distortions without significantly affecting the response or the stability of the RF amplifier.

In high bandwidth linear amplifiers, feedback is typically provided in a single transistor stages composed of a few transistors only. Thus, the phase is well controlled and a nonlinear feedback scheme is devisable with a controlled phase as is required for broadband cancellation. This scheme reduces the amount of feedback at large signal excursions, which increases the gain at those signals and which offsets the saturation behavior of the RF amplifier that would otherwise reduce the gain. Both the small and large signals' gains are kept equal to the small signal gain. Thus, the RF amplifier linearity is enhanced in a simple scheme without adding losses from power dissipation.

The present invention is also drawn to a method of utilizing the nonlinear feedback linearizer disclosed herein by combining the nonlinear feedback linearizer circuit of the present invention with an existing RF amplifier.

In a first general aspect, the present invention provides an apparatus for enhancing amplifier linearity over a frequency range, said apparatus comprising: an input frequency signal, said input frequency signal subject to signal excursions from a nominal signal level; circuitry which includes a circuit for generating a corrective signal having nonlinear characteristics; and a system for receiving the input frequency signal, said system including a circuit for applying a corrective signal to the input frequency signal.

In a second general aspect, the present invention provides a method for enhancing amplifier linearity over a frequency range, said method comprising: providing an input frequency signal, said input frequency signal subject to signal excursions from a nominal signal level; receiving the input frequency signal; generating a corrective signal having nonlinear characteristics; and applying the corrective signal to the input frequency signal.

In a third general aspect, the present invention provides an apparatus for reducing distortion in a transmitted signal, said apparatus comprising: at least one radio frequency amplifier; and at least one nonlinear feedback linearizer circuit operationally connected to said amplifier.

The foregoing and other features and advantages of the invention will be apparent from the following more particular description of embodiments of the invention.

BRIEF DESCRIPTION OF THE DRAWINGS

The features and inventive aspects of the present invention will become more apparent upon reading the following detailed description, claims, and drawings, of which the following is a brief description.

DETAILED DESCRIPTION OF THE EMBODIMENTS

The following is a detailed explanation of the nonlinear feedback linearization apparatus, and a method for using the improved nonlinear feedback linearization apparatus in embodiments of the present invention, with reference to the attached drawings. It should be noted that the same reference numbers are assigned to components having approximately the same functions and structural features in the following explanation and the attached drawings to preclude the necessity for repeated explanation thereof.

Figure 1:
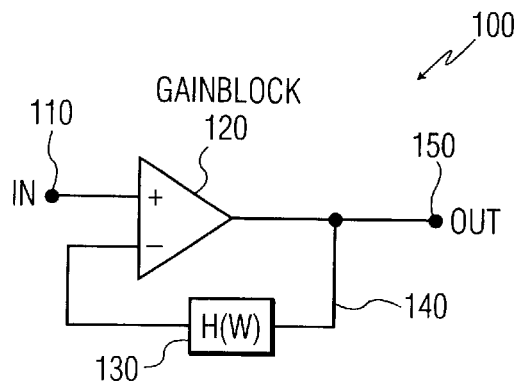
FIG. 1 is a block diagram representation of a normal feedback apparatus as embodied in the related art.

FIG. 1 shows a block diagram representation of a normal feedback apparatus as embodied in the related art. The block diagram 100 includes an input node 110, for receiving an input frequency signal, connected to the positive input of amplifier 120. The input frequency signal is characterized by having a nominal signal level, from which the input frequency signal may deviate due to electrical noise or other system faults which can cause excursions from the nominal input frequency signal level. Amplifier 120 also has an output node 150. The negative input to amplifier 120 is connected via feedback loop 140 to the output node 150. Feedback loop 140 includes a gain network 130.

Figure 2:
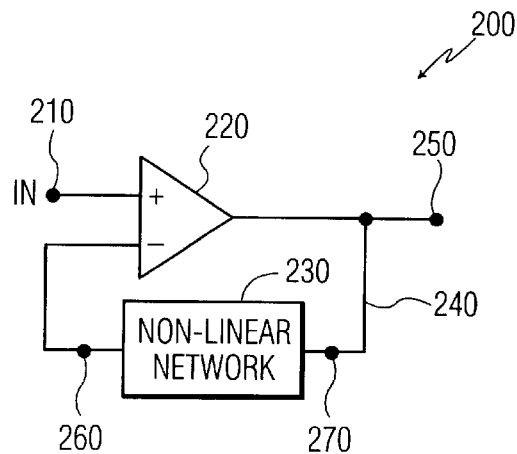
FIG. 2 is a block diagram of an exemplary nonlinear feedback linearization circuit in an embodiment of the present invention.

Referring now to FIG. 2, a block diagram representation of an exemplary embodiment of a nonlinear feedback linearization circuit of the present invention is shown. The block diagram 200 includes an input node 210 connected to the positive input of amplifier 220. Amplifier 220 also has an amplifier output node 250. The negative input to amplifier 220 is connected via feedback loop 240 to the output node 250. Feedback loop 240 includes a nonlinear gain network circuit 230 of the present invention. Nonlinear gain network circuit 230 has a network input node 270 and a network output node 260. Network input node 270 is connected to amplifier output node 250, while network output node is connected to the negative amplifier input node.

Nonlinear gain network circuit 230 provides a corrective signal, having a nonlinear characteristic, at network output node 260 which is applied to the negative input to amplifier 220. The nonlinear gain network circuit 230 can operate in broadband frequencies such as, inter alia, 54 MHz to 870 MHz. The nonlinear gain network circuit 230 can also operate in narrowband frequencies such as, inter alia, 900 MHz to 1 GHz. Further, nonlinear gain network circuit 230 may produce a controlled phase signal. The nonlinear gain network circuit 230 may provide a large signal gain such as, inter alia, >30 dB, and a small signal gain such as, inter alia, <10 dB. The nonlinear gain network circuit 230 may be operated such that these two gains, large and small, are kept substantially equal to each other during periods of signal excursions.

Figure 3:
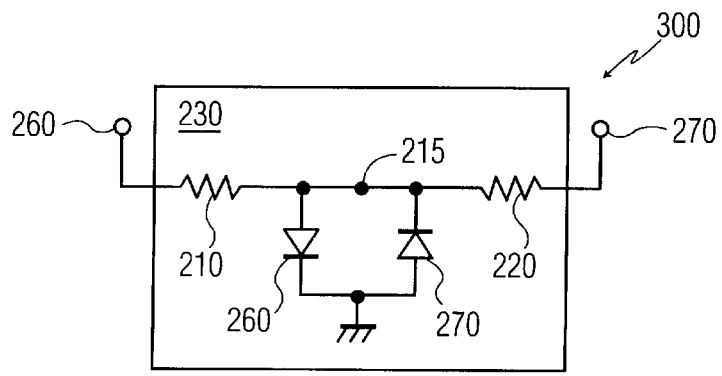
FIG. 3 is an exemplary nonlinear feedback linearization circuit of an embodiment of the present invention

Referring now to FIG. 3, a circuit diagram of one embodiment of a nonlinear feedback linearization network circuit of the present invention is shown. The circuit diagram 300 depicts one possible embodiment of the circuitry connected between network input node 270 and network output node 260. In the embodiment shown, a first resistor 210 and a second resistor 220 are connected in series between network input node 270 and network output node 260. Node 215 represents a point between the series connected resistors 210 and 220. A first diode 280 and a second diode 290 are connected in parallel, with reversed polarity, between node 215 and ground. First and second diodes may be replaced by another type of electronic, optical, or electro-optical switch such as, inter alia, a transistor element having two terminals connected together so that the transistor element functions as a diode.

Embodiments of the present invention have been disclosed. A person of ordinary skill in the art would realize, however, that certain modifications would come within the teachings of this invention. Therefore, the following claims should be studied to determine the true scope and content of the invention.

What is claimed is:

1. An apparatus for enhancing amplifier linearity over a frequency range, said apparatus comprising:
   circuitry which includes a first circuit for generating a corrective signal having nonlinear characteristics; and
   a system for receiving an input frequency signal, said input frequency signal subject to signal excursions from a nominal signal level, said system including a second circuit for applying a corrective signal to the input frequency signal, wherein said second circuit further comprises a differential amplifier adapted to receive said input frequency signal on a first input and said corrective signal on a second input.

2. The apparatus of claim 1, wherein the frequency range includes broadband radio frequencies.

3. The apparatus of claim 1, wherein the frequency range includes narrowband radio frequencies.

4. The apparatus of claim 1, wherein the corrective signal is a controlled phase signal.

5. The apparatus of claim 1, further wherein:
   the input frequency signal contains a distortion level and an overall output power level, the distortion level being smaller than the output power level;
   the circuit for applying a corrective signal to the input frequency signal is a feedback loop having a nonlinear characteristic; and
   the corrective signal cancels out the distortion level.

6. The apparatus of claim 5, wherein the feedback loop includes at least one transistor stage.

7. The apparatus of claim 1, wherein the feedback loop is an amplifier is characterized by:
   a small signal gain;
   a large signal gain; and
   the large signal gain is kept substantially equal to the small signal gain during conditions of signal excursions.

8. The apparatus of claim 1, wherein said differential amplifier is constructed with semiconductor transistors.

9. A method for enhancing amplifier linearity over a frequency range, said method comprising:
   providing an input frequency signal, said input frequency signal subject to signal excursions from a nominal signal level;
   receiving the input frequency signal at a first input of a differential amplifier;
   generating a corrective signal having nonlinear characteristics; and
   applying the corrective signal to the input frequency signal at a second input of the differential amplifier.

10. The method of claim 9, wherein the frequency range includes broadband radio frequencies.

11. The method of claim 9, wherein the frequency range includes narrowband radio frequencies.

12. The method of claim 9, wherein the corrective signal is a controlled phase signal.

13. The method of claim 9, further wherein:
   the input frequency signal contains a distortion level and an overall output power level, the distortion level being smaller than the output power level;
   wherein applying a corrective signal to the input frequency signal includes a feedback loop having a nonlinear characteristic; and
   the corrective signal cancels out the distortion level.

14. The method of claim 13, wherein the feedback loop includes at least one transistor stage.

15. The method of claim 9, wherein the step of receiving includes receiving the input frequency signal in an amplifier is characterized by:
   a small signal gain;
   a large signal gain; and
   the large signal gain is kept substantially equal to the small signal gain during conditions of large signal excursions.

16. The apparatus of claim 9, wherein said differential amplifier is constructed with semiconductor transistors.

17. An apparatus for reducing distortion in a transmitted signal, said apparatus comprising:
   at least one radio frequency amplifier, wherein said amplifier is a differential amplifier having a first input for receiving said transmitted signal, and a second input for receiving a feedback signal; and at least one nonlinear feedback linearizer circuit operationally connected to said second input of said differential amplifier, and adapted to provide said feedback signal to said second input.

18. The apparatus of claim 17, wherein the transmitted signal is a cable television signal.

* * * * *